United States Patent [19]

McClintic

[11] Patent Number: 4,491,781
[45] Date of Patent: Jan. 1, 1985

[54] PATCH CORD TESTER

[75] Inventor: Terry A. McClintic, Eugene, Oreg.

[73] Assignee: Fred O. Mercer, Hoven, S. Dak.

[21] Appl. No.: 397,593

[22] Filed: Jul. 12, 1982

[51] Int. Cl.³ .............................................. G01R 31/02
[52] U.S. Cl. .............................................. 324/51
[58] Field of Search .............. 324/51, 54; 340/650, 340/651, 652

[56] References Cited

U.S. PATENT DOCUMENTS 2,526,891 10/1950 Meyerhoff et al. .............. 324/54
3,064,186 11/1962 Vincent .
3,131,347 4/1964 Brooks et al. .
4,227,146 10/1980 Hodge .............................. 324/51
4,385,272 5/1983 Whitehead ......................... 324/51

Primary Examiner—Stanley T. Krawczewicz
Attorney, Agent, or Firm—Kolisch, Hartwell Dickinson & Anderson

[57] ABSTRACT

A tester unit for testing a patch cord to determine if a short, or a break in either of the conductive paths in the patch cord, exists. The tester unit includes a pair of jacks adapted to receive the plugs of a patch cord, and reverse connections of contacts in these jacks with the poles of an internally carried battery means.

4 Claims, 3 Drawing Figures

PATCH CORD TESTER

BACKGROUND AND SUMMARY OF THE INVENTION

This invention relates generally to testing apparatus and, more particularly, to a tester unit which may be utilized for the rapid testing of so-called patch cords to determine if the cord will function properly.

A patch cord commonly refers to an elongate conductor assembly which has plugs at either end and which is usable in interconnecting, for instance, various forms of electronic equipment, such as a player unit to a loud speaker, etc.

Common failures in a patch cord take the form of a short existing between the two contactors which are found in the plug at the end of a patch cord, or a break in the conductive path provided by one or the other of the two conductors which are found in a patch cord. Precise meter readings ordinarily are not required in the testing of a patch cord.

Generally, therefore, an object of this invention is to provide a tester unit for testing patch cords which may be utilized rapidly to determine the existence of the most commonly experienced reasons for failure in a patch cord.

Another object is to provide such a tester unit which is compact in size and simple in construction. As contemplated herein, the tester unit may easily be carried in a pocket. The simplicity of the unit renders it capable of being manufactured at relatively low cost.

Specifically, as contemplated herein, the tester unit comprises a housing which contains within it a battery pack, and a pair of jacks mounted on wall portions of the housing adapted to receive the plugs provided at the ends of a patch cord. As will become more fully apparent, the tester unit may be operated to determine if a short exists between the conductors of the patch cord, or to determine if a break is present in the conductive path extending from the plugs and including either one or the other of the conductors which are present in the patch cord.

These and other objects and advantages are attained by the invention, which will become more fully apparent from a reading of the following description, which is to be taken in conjunction with the accompanying drawings, wherein.

DETAILED DESCRIPTION OF A PREFERRED EMBODIMENT OF THE INVENTION

Figure 1:
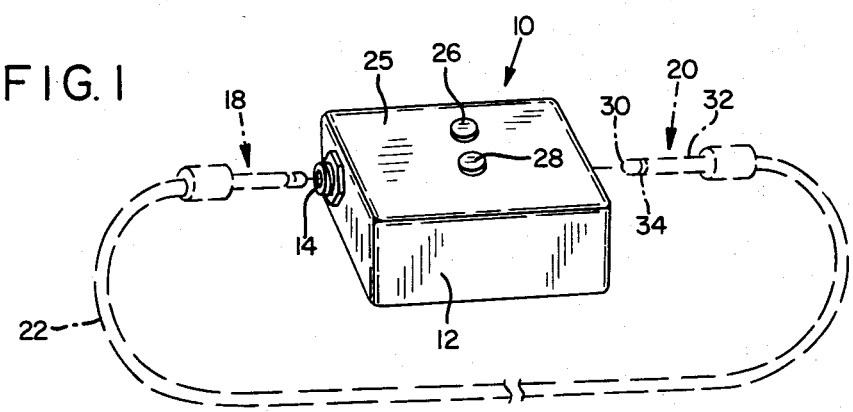
FIG. 1 illustrates, in perspective, a tester unit as contemplated, and further illustrates, in dashed outline, a patch cord equipped with the usual plugs at its opposite ends.

Referring now to the drawings, the tester unit, indicated generally at 10, comprises a rectangular hollow housing, also referred to herein as a frame, indicated at 12. Mounted on opposite side walls of the housing are jacks 14, 16, respectively. These are conventional, and open to the exterior of the housing, and are adapted to have inserted therewithin the plugs, such as those shown at 18, 20, which typically are provided at the opposite ends of a patch cord, shown at 22.

Disposed within the housing is a battery pack or battery means 24. Mounted in side wall 25 of the housing, and received within suitable apertures so as to be discernable from outside the housing, are a pair of signal devices, more specifically a pair of light-emitting diodes or electrically powered light sources 26, 28. The battery pack, jacks, and light-emitting diodes are suitably interconnected by conductor expanses housed within the housing. The side wall of the housing opposite side wall 25 is detachable to permit access to the housing interior.

A conventional type of patch cord includes a central conductor extending along the length thereof, which is electrically connected to a terminal contactor in the plug which is provided at each end of the patch cord, such terminal contactor being shown at 30 in connection with plug 20. The patch cord further includes a shield or ground conductor in tubular form which extends along the length of the patch cord and has the first-mentioned conductor extending within it. This conductor is electrically connected to another contactor 32 in the plug which is properly insulated from terminal contactor 30 by means including insulator 34.

Describing a jack, which is also conventional, such may include an elongate flexible contact such as contact 36 in jack 16 (see FIG. 3) electrically connected to a plate 38. With a plug inserted into the jack, this contact makes electrical connection with terminal contactor 30 in the plug. The jack further includes an annular contact 40 electrically connected to an arm 42. With a plug inserted into the jack, this annular contact makes electrical connection with contactor 32 in the plug.

Figure 3:
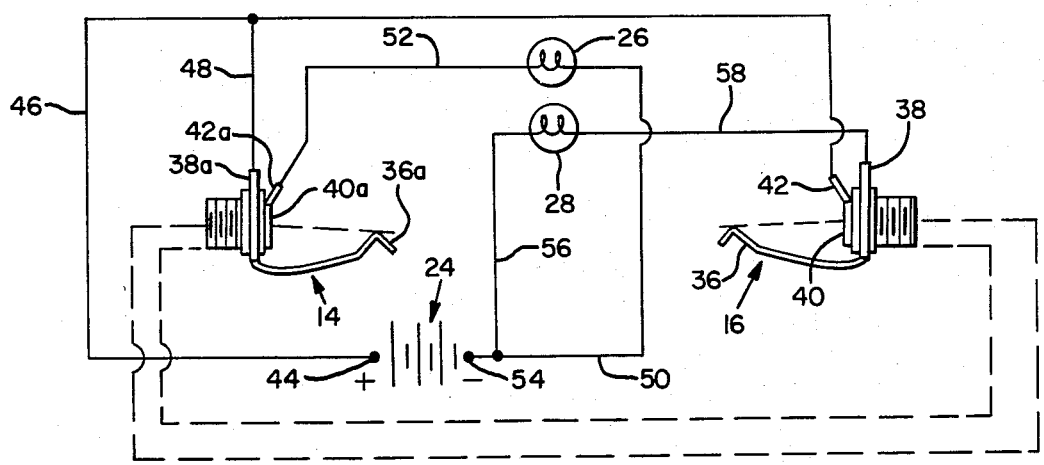
FIG. 3 illustrates schematically the electrical circuitry involved in the tester unit.

Conductors within the housing of the tester unit establish the electrical circuit illustrated in FIG. 3. In this discussion, the parts of jack 14 have been given reference numerals corresponding to the reference numerals employed in connection with jack 16, but followed by "a". For example, flexible contact 36a in jack 14 corresponds to contact 36 in jack 16, etc.

Describing the electrical circuit, pole 44 of battery pack 24 is connected directly by conductors 46, 48 to flexible contact 36a in jack 14 and annular contact 40 in jack 16. Thus, this pole is connected to one type of contact in one jack and the other type of contact in the other jack. Conductors 50, 52 provide a series connection extending from pole 54 in the battery pack and including light-emitting diode 26 to annular contact 40a in jack 14. Conductors 56, 58 connect in series light-emitting diode 28 and flexible contact 36 with pole 54.

Describing now how the tester unit may be utilized in testing the integrity of a patch cord, if the plug at one end of the patch cord is inserted into either jack, and in the absence of any short between contactors 30, 32 in the plug, neither of the light-emitting diodes will illuminate. If a short does exist, one of the diodes will illuminate, depending upon which jack the plug has been inserted into. A short of this nature most likely occurs where the conductors in the patch cord are soldered to the contactors of a plug, and these areas should be checked.

For example, if plug 18, having a short, is inserted into jack 14, flexible contact 36a is directly connected to annular contact 40a. Since plate 38a is connected via conductor 46 to positive pole 44 of source 24, contact 40a, and therefore arm 42a, is also connected to the positive voltage. This means conductor 52 is positive while conductor 50, connected to negative pole 54, is negative. Thus, diode 26 has a voltage across it causing it to illuminate.

Following this same logic for a plug 20 inserted into jack 16, a short in the plug, or otherwise between the two associated conductors in patch cord 22, produces a short between contacts 36 and 40. Contact 40 is connected to positive pole 44 through arm 42 and conductor 46. Diode 28 is connected on one side to negative pole 54 through conductor 56. On the other side, diode 28 has a positive voltage applied by conduction through conductor 58 from plate 38. The plate is connected to contact 36 which now has a positive voltage on it. Diode 28 therefore conducts, evidencing a short in patch cord 22 or the associated plugs.

If no short exists, the plugs at opposite ends of the patch cord are inserted into the respective jacks. This should cause both light-emitting diodes to illuminate if there is an unbroken conductive path extending between the terminal contactors 30 of the two plugs, and an unbroken conductive path extending between contactors 32 of the two plugs. A failure of lower diode 28 in FIG. 3 to illuminate indicates a break in the conductive path between terminal contactors 30 of the two plugs in the patch cord. A failure of upper diode 26 in FIG. 3 to illuminate indicates that the conductive path between contactors 32 in the two plugs is broken.

Specifically, when both plugs are inserted in the jacks similar but separate circuits are established for the two conductors in the patch cord. Describing first the circuit associated with contacts 36 and 36a, a negative voltage exists on one side of diode 28. The other side of the diode is connected in series to conductor 58, plate 38, contact 36, contactor 30 of plug 20, through patch cord 22 to contactor 30 of plug 18, contact 36a and plate 38a. Plate 38a, as was just discussed, has a positive voltage on it from pole 44. Thus, if the patch cord is good, diode 28 lights up. But if an open exists in it, a voltage will not appear across diode 28 and it will not be illuminated.

A similar series circuit applies to the conductor of patch cord 22 associated with contactors 32 of the plugs. A negative voltage exists on one side of diode 26 through conductor 50. The other side is connected in series to arm 42a and contact 40a of jack 14. From contact 40a connection exists through the other conductor of the patch cord between contactors 32 of plugs 18, 20. Then, contact is completed to positive pole 44 via conductor 46 extending from arm 42 and contact 40 of jack 16. If there are no opens in the patch cord, diode 26 illuminates. A break or open in the patch cord prevents the illumination of the diode.

Figure 2:
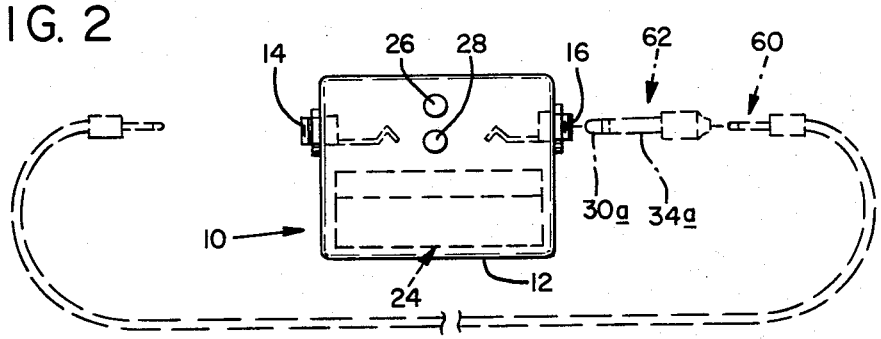
FIG. 2 illustrates the tester unit in FIG. 1 in plan view, showing in dashed outline various internal components in the tester unit, and further illustrating, in dashed outline, how an adapter might be utilized in adapting a plug for insertion into the unit.

Referring to FIG. 2, in the event a patch cord is being tested which terminates in a plug such as a so-called mini plug, as shown at 60 in FIG. 2, which does not properly fit the jacks provided in the tester unit, testing of the patch cord may be accomplished by use of an adapter, such as the one shown at 62, which receives the mini plug and provides at its prong end contactors 30a and 32a, constructed as are the contactors in the plugs described in connection with patch cord 22.

It will be obvious from the above that a simple tester unit has been devised which enables rapid checking of the most commonly experienced defects found in patch cords. The tester unit need not include switch devices or other complicated circuitry to enable it to perform its functions. The unit may be made in pocket size. The unit is capable of being manufactured at low cost, and thus constitutes a testing tool easily within the price range of those having a need for such a device.

While an embodiment of the invention has been disclosed in detail, obviously variations are possible without departing from the invention.

It is claimed and desired to secure by Letters Patent:

1. A patch-cord tester unit comprising:
   a frame and battery means with positive and negative poles mounted on said frame,
   a pair of electrically powered jacks mounted on said frame, each jack having a first contact for making contact with one type of contactor in the plug of a patch cord and a second contact for making contact with another type of contactor in the plug of a patch cord,
   a pair of electrically powered signal devices,
   a conductor means connecting one battery pole directly to the first contact of one jack and the second contact of the other jack, and
   a conductor means connecting in series the other battery pole, one signal device, and the second contact of said one jack, and connecting in series the other battery pole, the other signal device, and the first contact of said other jack.

2. The device of claim 1, wherein said frame comprises a housing, said battery means and conductor means are mounted within the housing, and said signal devices are discernable outside the housing.

3. The device of claim 2, wherein said electrically powered signal devices are electrically powered light emitting devices.

4. A tester unit for testing a patch cord having plugs at opposite ends and a pair of conductors interconnecting the plugs comprising:
   a housing and battery means mounted within said housing having positive and negative poles,
   a pair of jacks mounted on wall portions of said housing, each accessible to a plug inserted thereinto exteriorly of the housing, each jack having a first contact for making contact with one type of contactor in the plug of a patch cord and a second contact for making contact with another type of contactor in the plug of a patch cord,
   a pair of signal devices mounted on wall portions of the housing discernable from the exterior of the housing,
   and conductor means within said housing establishing, for at least one jack, a series connection between one pole and one of the contacts of the jack and a series connection between the other pole, a signal device and the other contact of the jack,
   said conductor means further establishing, with the plugs at the opposite ends of a patch cord properly received by the respective jacks, and with the pair of conductors in of the patch cord having proper integrity, a series connection between the poles of the battery means which includes one conductor in the patch cord and one signal device, and a series connection between the poles of the battery means which includes the other conductor of the patch cord and the other signal device.

* * * * *